(12) United States Patent
Sanchez

(10) Patent No.: US 11,482,432 B2
(45) Date of Patent: Oct. 25, 2022

(54) METHOD AND APPARATUS FOR SEMICONDUCTOR PROCESSING

(71) Applicant: Applied Materials, Inc., Santa Clara, CA (US)

(72) Inventor: Errol Antonio C. Sanchez, Tracy, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/904,139

(22) Filed: Jun. 17, 2020

(65) Prior Publication Data

US 2021/0005478 A1 Jan. 7, 2021

Related U.S. Application Data

(60) Provisional application No. 62/881,453, filed on Aug. 1, 2019, provisional application No. 62/870,124, filed on Jul. 3, 2019.

(51) Int. Cl.
*H01L 21/67* (2006.01)
*H01L 21/687* (2006.01)
*C23C 16/458* (2006.01)
*H01L 21/683* (2006.01)

(52) U.S. Cl.
CPC .... *H01L 21/67103* (2013.01); *C23C 16/4584* (2013.01); *C23C 16/4586* (2013.01); *H01L 21/68742* (2013.01); *H01L 21/68764* (2013.01); *H01L 21/6831* (2013.01); *H01L 21/6838* (2013.01)

(58) Field of Classification Search
CPC ......... H01L 21/67103; H01L 21/68742; H01L 21/68764; H01L 21/6838; H01L 21/6831; H01L 21/67115; H01L 21/67109; C23C 16/4586; C23C 16/4584
See application file for complete search history.

(56) References Cited

U.S. PATENT DOCUMENTS

| 7,294,241 B2 * | 11/2007 | Seet ..................... C23C 14/165 204/192.12 |
| 9,368,370 B2 * | 6/2016 | Belostotskiy ..... H01J 37/32357 |
| 2021/0104414 A1 * | 4/2021 | Panagopoulos ... H01L 21/67115 |

* cited by examiner

*Primary Examiner* — Duy Vu N Deo
(74) *Attorney, Agent, or Firm* — Servilla Whitney LLC

(57) ABSTRACT

Methods of processing a semiconductor substrate and apparatus to process semiconductor substrates are described. The methods and apparatus described enable the repetitive cyclic low temperature application of a chemistry and high temperature treatment step to a substrate.

19 Claims, 3 Drawing Sheets

METHOD AND APPARATUS FOR SEMICONDUCTOR PROCESSING

CROSS-REFERENCE TO RELATED APPLICATIONS

This application claims priority to U.S. Provisional Application No. 62/870,124, filed Jul. 3, 2019 and to U.S. Provisional Application No. 62/881,453, filed Aug. 1, 2019, the entire disclosures of which are hereby incorporated by reference herein.

TECHNICAL FIELD

Embodiments of the present invention pertain to the field of electronic device manufacturing. In particular, embodiments pertain to processing methods and processing chambers.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components. Extreme challenges in applying materials in nanometer scale, high aspect ratio structures, and deeply buried features require advances on both the processing methods and physico-chemical properties of the materials.

New semiconductor processing methods may require that materials be generated on the substrates via a sequence of steps involving widely different physical and chemical conditions, all performed in the same processing chamber as to be expedient, economical and practical. Each step in the sequence alters the physical and chemical state of the material, but possibly also of the substrate and processing chamber which may be undesired for the succeeding steps. Cooldown of the chamber and substrate are very slow between a hot step and succeeding step that is many hundreds of degrees cooler. Repeated cycling between very low and very high temperatures is even slower.

Semiconductor processing requires uniform and repeatable exposure of the entire wafer substrate to chemistries of precise composition at exact instances and conditions of temperature and pressure. Such chemistries as well as the material modification can leave residues within the processing chamber, thus complicating the processing at succeeding steps and of subsequent wafers. Repeated cycling of chemistries further present challenges. Wafer position control is also problematic when pressure cycling is required. Accordingly, there is a need for apparatus and processing methods which provide fast and reliable control of substrate temperatures and chamber ambient conditions.

SUMMARY

One or more embodiments of the disclosure are directed to a processing method. In one or more embodiments, a processing method comprises: positioning a substrate a first distance from a cooled pedestal; and performing a reaction cycle comprising carrying out a first process at the first distance, the first process having a first temperature and first pressure, moving the substrate from the first distance to a second distance from the cooled pedestal, the second distance greater than the first distance, carrying out a second process at the second distance, the second process having a second temperature and a second pressure, and moving the substrate from the second distance to the first distance.

Further embodiments of the disclosure are directed to an apparatus. In one or more embodiments, a processing chamber comprises: a chamber body having a top, bottom and at least one sidewall enclosing a chamber interior; a cooled pedestal within the chamber interior; a substrate support within the chamber interior, the substrate support having a support surface and configured to move between a first position and a second position, the first position having the support surface a first distance from the cooled pedestal, the second position having the support surface a second distance from the cooled pedestal greater than the first distance; a gas injector configured to provide one or more flows of gas into the chamber interior; a heater positioned a third distance from the cooled pedestal, the third distance greater than the first distance and the second distance; and a controller configured to perform the method of one or more embodiments.

Other embodiments of the disclosure are directed to a non-transitory computer readable medium including instructions, that, when executed by a controller of a processing chamber, cause the processing chamber to perform operations of: positioning a substrate a first distance from a cooled pedestal; carrying out a first process at the first distance, the first process having a first temperature and first pressure; moving the substrate from the first distance to a second distance from the cooled pedestal, the second distance greater than the first distance; carrying out a second process at the second distance, the second process having a second temperature and a second pressure; and moving the substrate from the second distance to the first distance.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
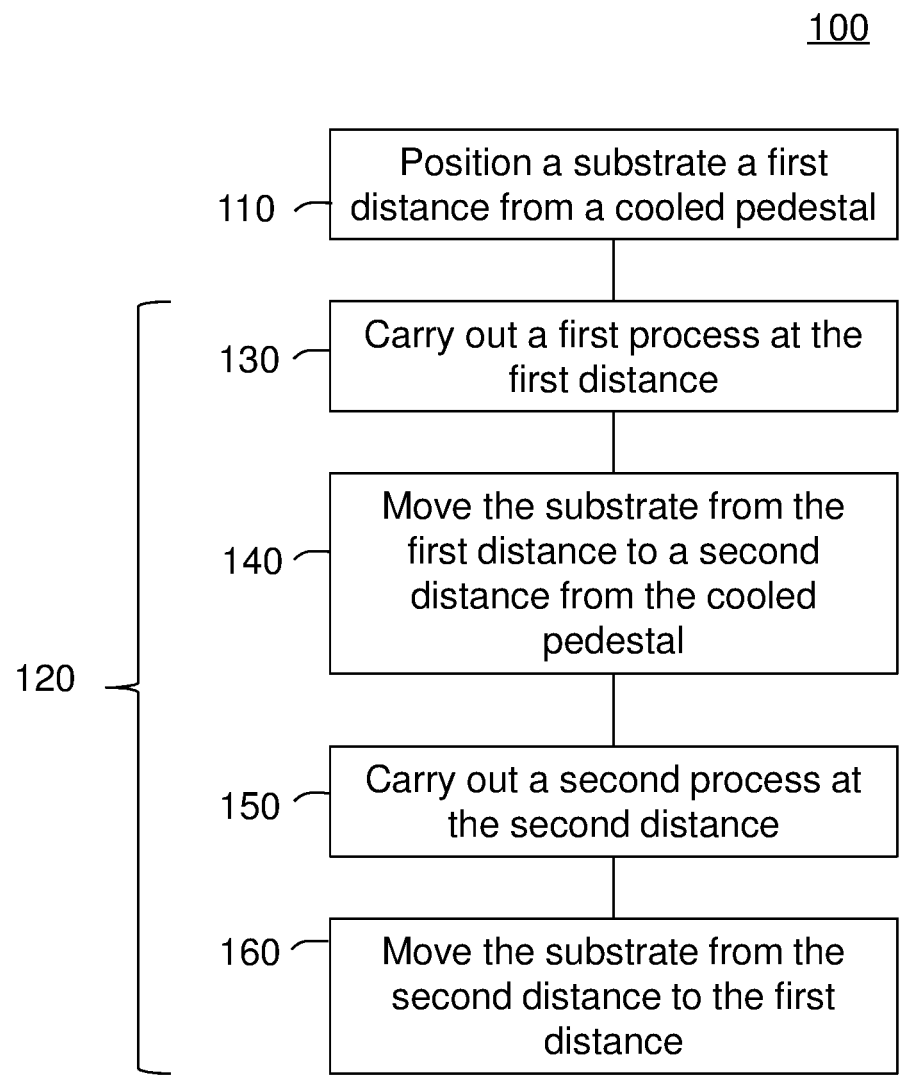
FIG. 1 depicts a flow diagram of a processing method in accordance with one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, in one or more embodiments, a substrate surface on which processing is performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

As used in this specification and the appended claims, the terms "precursor", "reactant", "reactive gas" and the like are used interchangeably to refer to any gaseous species that can react with the substrate surface.

Embodiments of the present disclosure relate to methods and apparatus that enable the repetitive cyclic low temperature (about 30° C. to about 500° C.) application of a chemistry and high temperature treatment step (about >500° C. to about 1000° C.) to a wafer with or without device features. In one or more embodiments, the overall process results in one or more of film formation, material removal, or material conversion. In one or more embodiments, apparatus design features are provided for fast wafer cooldown and heat-up, gas injection and wafer position control during pressure transition and chemistry exposure steps, and chamber clean.

FIG. 1 depicts a flow diagram of a method 100 for processing a substrate in accordance with one or more embodiments of the present disclosure. At operation 110 a substrate is positioned a first distance from a cooled pedestal. At operation 120, a reaction cycle is performed. In one or more embodiments, the reaction cycle comprises operation 130 carrying out a first process at the first distance. In one or more embodiments, the first process has a first temperature and a first pressure. At operation 140, the substrate is moved from the first distance to a second distance from the cooled pedestal. In one or more embodiments, the second distance is greater than the first distance. At operation 150, a second process is carried out at the second distance. In one or more embodiments, the second process has a second temperature and a second pressured. At operation 160, the substrate is moved from the second distance to the first distance.

Figure 2A:
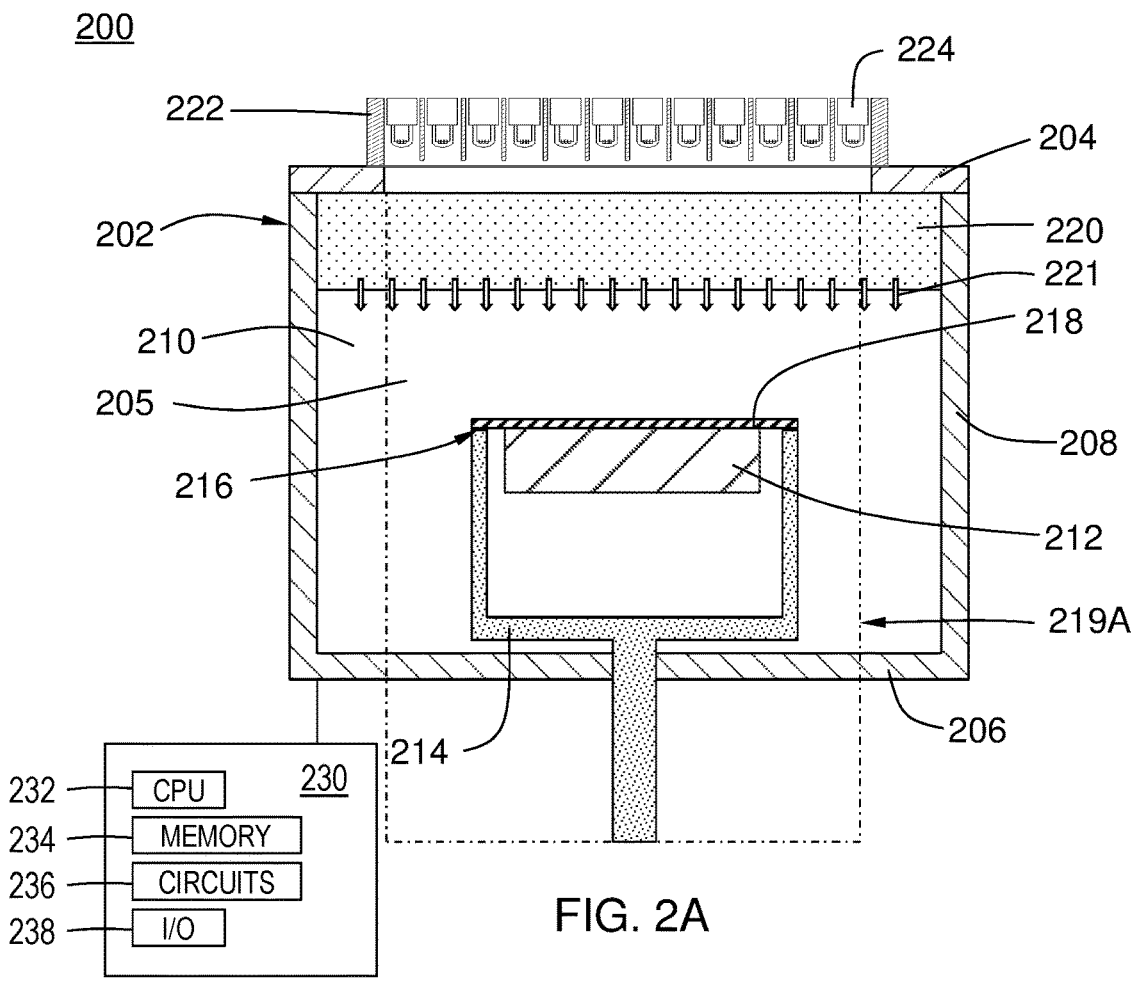
FIG. 2A illustrates a cross-sectional schematic view of a processing chamber in accordance with one or more embodiment of the disclosure.
Figure 2B:
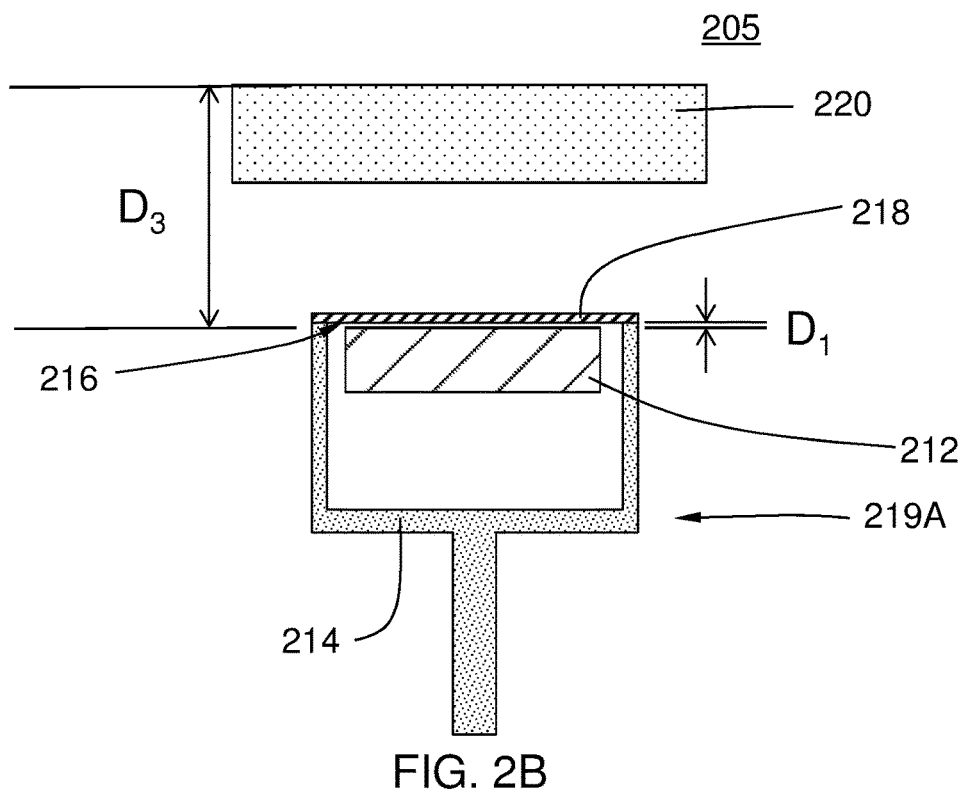
FIG. 2B illustrates an enlarged cross-sectional view of the processing system of FIG. 2A.
Figure 3A:
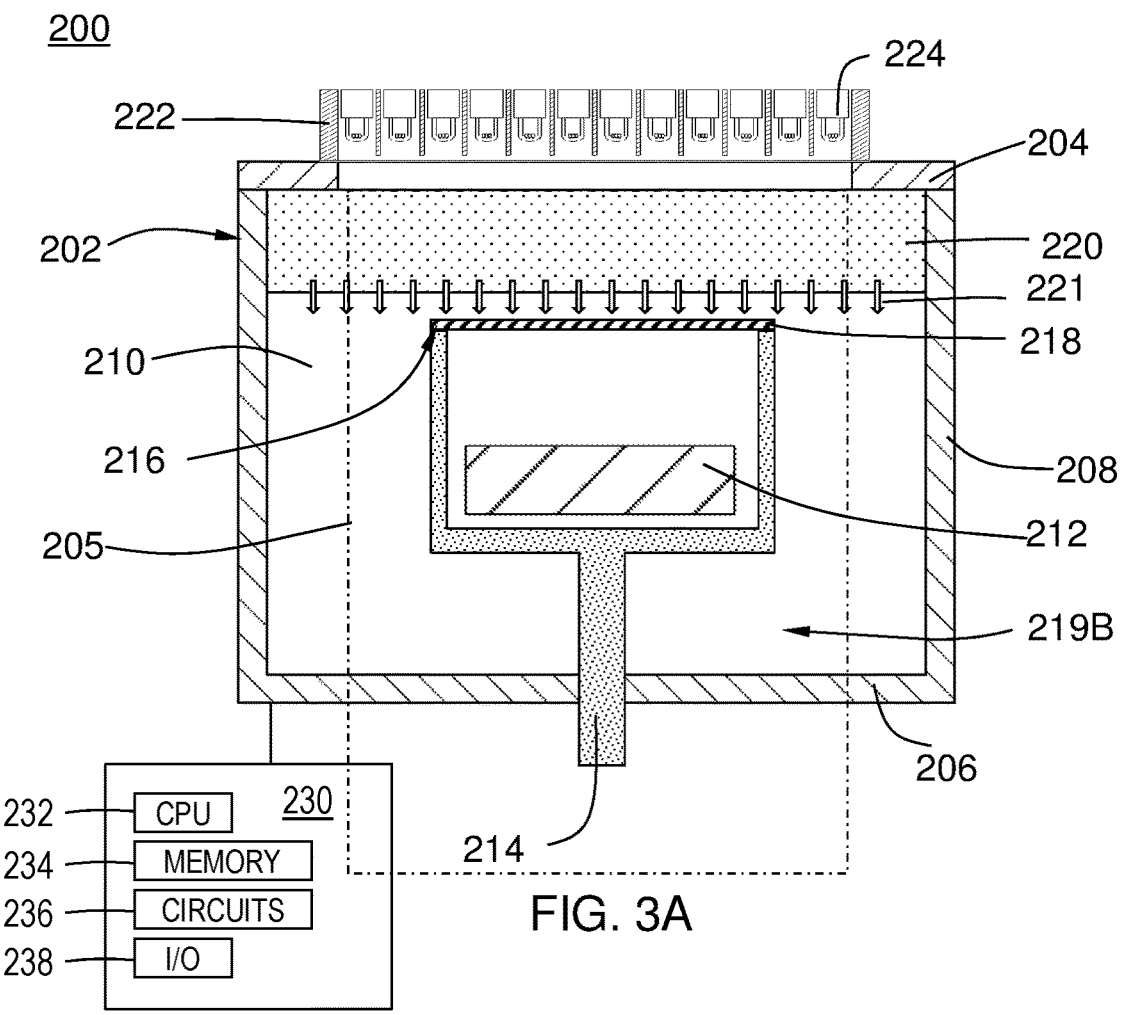
FIG. 3A illustrates a cross-sectional schematic view of a processing chamber in accordance with one or more embodiment of the disclosure.
Figure 3B:
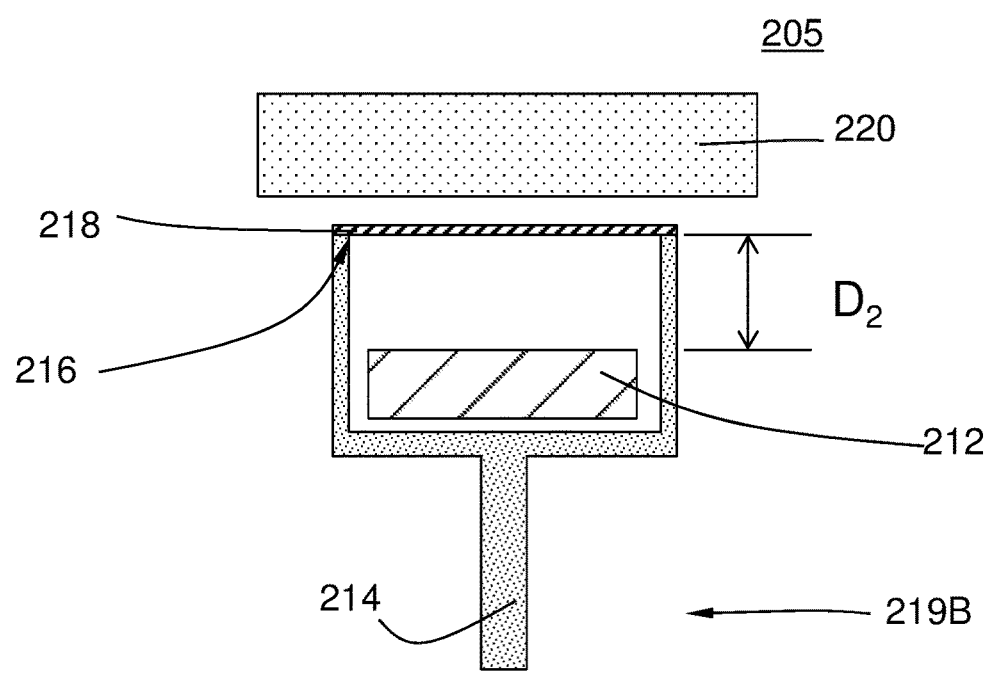
FIG. 3B illustrates an enlarged cross-sectional view of the processing system of FIG. 3A.

FIG. 2A illustrates a cross-sectional schematic view of a processing chamber in accordance with one or more embodiment of the disclosure. FIG. 2B illustrates an enlarged cross-sectional view 205 of the processing system of FIG. 2A. FIG. 3A illustrates a cross-sectional schematic view of a processing chamber in accordance with one or more embodiment of the disclosure. FIG. 3B illustrates an enlarged cross-sectional view 205 of the processing system of FIG. 3A. Referring to FIGS. 2A to 3B, a processing chamber 200 comprises a chamber body 202 having a top 204, a bottom 206, and at least one sidewall 208 enclosing a chamber interior 210. In one or more embodiments, a cooled pedestal 212 is within the chamber interior 210. In one or more embodiments, a substrate support 214 is within the chamber interior 210, the substrate support 214 having a support surface 216 and configured to move between a first position 219A and a second position 219B (see FIGS. 3A and 3B), the first position 219A having the support surface 216 a first distance $D_1$ from the cooled pedestal 212, the second position 219B having the support surface 216 a second distance $D_2$ from the cooled pedestal 212 greater than the first distance $D_1$. In one or more embodiments, processing chamber 200 comprises a gas injector 220 configured to provide one or more flows of gas 221 into the chamber interior 210. In one or more embodiments, a heater 222 is positioned a third distance $D_3$ from the cooled pedestal 212, the third distance $D_3$ greater than the first distance $D_1$ and the second distance $D_2$. In one or more embodiments, the processing chamber 200 comprises a controller 230 configured to perform the method of one or more embodiments.

In one or more embodiments, the controller 230 includes a central processing unit (CPU) 232, a memory 234, and a support circuit 236 utilized to control the process sequence and regulate the gas flows from the gas injector 220, and an input/output (I/O) 238. The central processing unit (CPU) 232 may be of any form of a general-purpose computer processor that may be used in an industrial setting. In one or more embodiments, the software routines are stored in the memory 234, such as random access memory, read only memory, floppy, or hard disk drive, or other form of digital storage. The support circuit 236 is conventionally coupled to the central processing unit (CPU) 232 and may include cache, clock circuits, input/output systems, power supplies, and the like. Bidirectional communications between the controller 230 and the various components of the substrate processing system 200 are handled through numerous signal cables collectively referred to as signal buses 238, some of which are illustrated in FIGS. 2A and 3A.

In one or more embodiments, the memory 234 includes one or more of transitory memory (e.g., random access memory) and non-transitory memory (e.g., storage). The memory 234, or computer-readable medium, of the processor may be one or more of readily available memory such as random access memory (RAM), read-only memory (ROM), floppy disk, hard disk, or any other form of digital storage, local or remote. In one or more embodiments, the memory 234 retains an instruction set that is operable by the processor to control parameters and components of the system.

In one or more embodiments, processes are stored in the memory 234 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller 230) that controls the chamber operation such that the processes are performed.

The controller 230 of some embodiments is configured to interact with hardware to perform the programmed function. For example, in one or more embodiments, the controller 230 is configured to control one or more valves, motors, actuators, power supplies, etc.

In some embodiments, the controller 230 is coupled to the processing chamber 200. The controller has one or more configurations to control the various functions and processes. In some embodiments, the configurations are selected from a first configuration to position a substrate a first distance from a cooled pedestal, a second configuration to carry out a first process at the first distance, the first process having a first temperature and first pressure, a third configuration to move the substrate from the first distance to a second distance from the cooled pedestal, the second distance greater than the first distance, a fourth configuration to carry out a second process at the second distance, the second process having a second temperature and a second pressure and/or a fifth configuration to move the substrate from the second distance to the first distance.

In one or more embodiments, the heater 222 is selected from a resistive heater or a plurality of lamps 224 (as illustrated). In one or more embodiments, wherein the heater comprises a plurality of lamps positioned to direct radiant energy through the top of the chamber body. In one or more embodiments, the gas injector is configured to provide a flow of gas from the top of the chamber body and the gas injector is transparent to at least a portion of the radiant energy from the plurality of lamps. In other embodiments, the gas injector is not transparent to the radiant energy as to serve as a hot plate.

In some embodiments, the gas injector 220 is configured to provide a flow of gas 221 from the sidewall 208 of the chamber body 202. In such embodiments, the controller 230 is configured to rotate the substrate support 214 when a gas is flowing from the gas injector 220. In other embodiments, the gas injector 220 is configured to provide a flow of gas 221 from the top 204 of the chamber body 202 (as illustrated in FIGS. 2A to 3B).

In one or more embodiments, a substrate 218 is positioned a first distance $D_1$ from a cooled pedestal 212. In one or more embodiments, the cooled pedestal 212 is maintained at a temperature in a range of about −10° C. to about 10° C. In some embodiments, the cooled pedestal further comprises a chuck. As used herein, the term "chuck" refers to a device used in a variety of semiconductor processes to hold the substrate during processing. In one or more embodiments, the chuck comprises one or more of an electrostatic chuck or a vacuum chuck. In one or more embodiments, the electrostatic chuck may be fabricated from aluminum, ceramic, and other suitable materials. In some embodiments, electrostatic chucks employ a platen with integral electrodes which are biased with high voltage to establish an electrostatic holding force between the platen and substrate (or wafer), thereby "chucking" the substrate.

In one or more embodiments, with a substrate 218 positioned a first distance $D_1$ from a cooled pedestal 212, a reaction cycle is then performed. In one or more embodiments, the first distance $D_1$ is less than or equal to about 5 mm. In some embodiments, the first distance $D_1$ is 0 mm such that the substrate 218 is sitting directly on the cooled pedestal 212. In one or more embodiments, the reaction cycle comprises carrying out a first process at the first distance $D_1$. In one or more embodiments the first process has a first temperature and a first pressure. In some embodiments, the first temperature is in the range of about 30° C. to about 500° C., including about 40° C., about 50° C., about 60° C., about 70° C., about 80°, about 90° C., about 100° C., about 125° C., about 150° C., about 175° C., about 200° C., about 225° C., about 250° C., about 275° C., about 300° C., about 325° C., about 350° C., about 375° C., about 400° C., about 425° C., about 450° C., about 475° C., or about 500° C. In one or more embodiments, the first pressure is in the range of about 1 torr to about 760 torr, including about 5 torr, about 25 torr, about 75 torr, about 125 torr, about 150 torr, about 175 torr, about 200 torr, about 225 torr, about 250 torr, about 275 torr, about 300 torr, about 325 torr, about 375 torr, about 400 torr, about 425 torr, about 450 torr, about 475 torr, about 500 torr, about 525 torr, about 550 torr, about 575 torr, about 600 torr, about 625 torr, about 650 torr, about 675 torr, about 700 torr, about 725 torr, or about 750 torr.

In one or more embodiments, the reaction cycle may be repeated one or more times, including repeating the reaction cycle two times, or repeating the reaction cycle more than two times. In one or more embodiments, the reaction cycle further comprises chucking the substrate 218 to the substrate support 214 after moving the substrate 218 to the first distance $D_1$.

In one or more embodiments, the substrate 218 is positioned on the cooled pedestal 212, but is unchucked. Thus, in one of more embodiments, prior to performing the reaction cycle for a first time, the substrate 218 is not chucked to the substrate support 214. In one or more embodiments, the substrate is heated by a plurality of lamps 224 to a stable temperature $T_1$ in a range of about 30° C. to about 500° C. In one or more embodiments, chemistry is dosed onto the substrate surface at some pressure $P_1$ for some time $k_1$, after which chemistry is purged out of the processing volume 210. In one or more embodiments, the first process is selected from a film formation, film deposition, material removal, or material conversion. In one or more embodiments, film deposition, includes, but not limited to, atomic layer deposition (ALD), physical vapor deposition (PVD), chemical vapor deposition (CVD), and the like.

In one or more embodiments, the substrate 218 is stationary or rotated during processing. A rotating substrate, in some embodiments, is rotated continuously or in discreet steps. For example, in one or more embodiments, a substrate is rotated throughout the entire process, or the substrate is rotated by a small amount between exposure to different reactive or purge gases. Rotating the substrate during processing (either continuously or in steps) may help produce a more uniform deposition or etch by minimizing the effect of, for example, local variability in gas flow geometries. In one or more embodiments, the method further comprises rotating the substrate support 214 during one or more of the first process or the second process.

In one or more embodiments, the first process comprises injecting a first process gas. In other embodiments, the first process comprises sequential exposure of the substrate 218 to a precursor, a purge gas, an oxidant, and a purge gas. In other embodiments, two precursors are co-flowed over the surface of the substrate 218, followed by purge gas, oxidant, and purge gas. In one or more embodiments, the first process gas is selected from, but not limited to, nitrogen ($N_2$), helium (He), argon (Ag), water ($H_2O$), molecular oxygen ($O_2$), ozone ($O_3$), a compound source of Si and/or other group IV elements, a compound source of boron (B) and/or other group III elements, a compound source of P and/or other group V elements, or combinations thereof.

In one or more embodiments, the substrate 218 is moved from the first distance $D_1$ to a second distance $D_2$ from the cooled pedestal 212, the second distance $D_2$ greater than the first distance $D_1$. In one or more embodiments, the second distance is in the range of greater than about 20 mm to about 200 mm, including about 40 mm, about 60 mm, about 80 mm, about 110 mm, about 140 mm, or about 170 mm. The pressure is transitioned to a second pressure, $P_2$, the second pressure in the range of about 10 torr to about 760 torr, including about 50 torr, about 75 torr, about 100 torr, about 125 torr, about 150 torr, about 175 torr, about 200 torr, about 225 torr, about 250 torr, about 275 torr, about 300 torr, about 325 torr, about 375 torr, about 400 torr, about 425 torr, about 450 torr, about 475 torr, about 500 torr, about 525 torr, about 550 torr, about 575 torr, about 600 torr, about 625 torr, about 650 torr, about 675 torr, about 700 torr, about 725 torr, or about 750 torr. In one or more embodiments, when the substrate 218 is at the second distance D2, the substrate 218 is heated by the heater 222 (and, in some cases, the plurality of lamps 224) to a stable second temperature, $T_2$, in the range of greater than about 500° C. to about 1000° C., including about 525° C., about 550° C., about 575° C., about 600° C., about 625° C., about 650° C., about 675° C., about 700° C., about 725° C., about 750° C., about 775° C., about 800° C., about 825° C., about 850° C., about 875° C., about 900° C., about 925° C., about 950° C., about 975° C., or about 1000° C. In one or more embodiments, the substrate 218 is treated at the second temperature $T_2$ and the second pressure $P_2$ with a second process gas for a period of time $k_2$. In one or more embodiments, the second process gas comprises one or more of an inert gas or a reactive gas or a mixture thereof.

In one or more embodiments, the second process comprises injecting a second process gas. In other embodiments, the second process comprises sequential exposure of the substrate 218 to a precursor, a purge gas, an oxidant, and a purge gas. In other embodiments, two precursors are co-flowed over the surface of the substrate 218, followed by purge gas, oxidant, and purge gas. In one or more embodiments, the second process gas is selected from, but not limited to, nitrogen ($N_2$), hydrogen ($H_2$), helium (He), argon (Ag), ammonia ($NH_3$), water ($H_2O$), molecular oxygen ($O_2$), ozone ($O_3$), or combinations thereof.

In one or more embodiments, the substrate 218 is then moved back to the first distance $D_1$ from the cooled pedestal 212. In one or more embodiments, the substrate 218 is chucked, and then the substrate is pump-purged with an inert gas and the substrate 218 is cooled to about the first temperature $T_1$. In one or more embodiments, as the pressure is returned to the first pressure $P_1$ with an inert gas, the substrate is returned to the cooled pedestal 212 and unchucked. In one or more embodiments, the reaction cycle is then repeated, so that the substrate 218 is cycled between distances $D_1$ and $D_2$ and the associated temperature, pressure and process gases at those distances. In one or more embodiments, substrate 218 starts from distance $D_2$ and the process there at, then proceeding to distance $D_1$ and the repeated cycling.

Other embodiments of the present disclosure are directed to a non-transitory computer readable medium including instructions, that, when executed by a controller of a processing chamber, cause the processing chamber to perform operations of: positioning a substrate 218 a first distance $D_1$ from a cooled pedestal 212; carrying out a first process at the first distance $D_1$, the first process having a first temperature, $T_1$, and first pressure, $P_1$; moving the substrate 218 from the first distance $D_1$ to a second distance $D_2$ from the cooled pedestal 212, the second distance $D_2$ greater than the first distance $D_1$; carrying out a second process at the second distance $D_2$, the second process having a second temperature, $T_2$, and a second pressure, $P_2$; moving the substrate from the second distance $D_2$ to the first distance $D_1$.

During processing, in one or more embodiments, the substrate is heated or cooled. Such heating or cooling is accomplished by any suitable means including, but not limited to, setting the temperatures of the cooled pedestal, of the gas injector 220, of the heater 222, of the lamps 224, setting the distances $D_1$ and $D_2$, and flowing heated or cooled gases to the substrate top and bottom surfaces. In some embodiments, the substrate support includes a heater/cooler which is controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

In one or more embodiments, the substrate is stationary or rotated during processing. A rotating substrate, in one or more embodiments, is rotated (about the substrate axis) continuously or in discrete steps. For example, in one or more embodiments, a substrate is rotated throughout the entire process, or the substrate is rotated by a small amount between exposures to different reactive or purge gases. Rotating the substrate during processing (either continuously or in steps) may help produce a more uniform deposition or etch by minimizing the effect of, for example, local variability in gas flow geometries.

In one or more embodiments, a chamber cleaning is performed after each substrate processing. In one or more embodiments, the chamber cleaning removes the residues. In some embodiments, dissociated ammonium fluoride ($NF_3$) from a remote plasma is used for the chamber cleaning. In other embodiments, thermal chlorine ($Cl_2$) or hydrochloric acid (HCl) are used for the chamber cleaning.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   positioning a substrate on a substrate support a first distance from a cooled pedestal, the cooled pedestal comprising an electrostatic chuck, the cooled pedestal positioned a set distance from a gas injector within a processing chamber;
   chucking the substrate using the electrostatic chuck to employ a platen with integral electrodes which are biased with a voltage to establish an electrostatic holding force between the platen and the substrate; and
   performing a reaction cycle comprising:
      carrying out a first process at the first distance, the first process having a first temperature and first pressure,
      moving the substrate from the first distance to a second distance from the cooled pedestal, the second distance greater than the first distance,
      carrying out a second process at the second distance, the second process having a second temperature and a second pressure, and
      moving the substrate from the second distance to the first distance,
   wherein the cooled pedestal is maintained the set distance from the gas injector while chucking the substrate and during the reaction cycle.

2. The processing method of claim 1, wherein the cooled pedestal is maintained at a temperature in a range of about −10° C. to about 10° C.

3. The processing method of claim 1, further comprising repeating the reaction cycle one or more times.

4. The processing method of claim 3, wherein the reaction cycle starts at the second distance with the second process.

5. The processing method of claim 1, wherein the reaction cycle further comprises chucking the substrate to the cooled pedestal after moving the substrate to the first distance.

6. The processing method of claim 5, wherein after chucking the substrate, the substrate is released from being chucked to the cooled pedestal prior to the first process.

7. The processing method of claim 1, further comprising rotating the substrate support during one or more of the first process or the second process.

8. The processing method of claim 1, wherein the first process comprises injecting a first process gas.

9. The processing method of claim 1, wherein the first temperature is in a range of from about 30° C. to about 500° C., and the first pressure is in a range of from about 1 torr to about 760 torr.

10. The processing method of claim 1, wherein the first distance is less than or equal to about 5 mm.

11. The processing method of claim 1, wherein the second process comprises injecting a second process gas.

12. The processing method of claim 1, wherein the second temperature is in a range of from greater than 500° C. to about 1000° C., and the second pressure is in a range of from about 10 torr to about 760 torr.

13. The processing method of claim 1, wherein the second distance is in a range of greater than 10 mm to about 200 mm.

14. A processing chamber comprising:
   a chamber body having a top, bottom and at least one sidewall enclosing a chamber interior;
   a cooled pedestal comprising an electrostatic chuck within the chamber interior the electrostatic chuck having a platen with integral electrodes which are biased with a voltage to establish an electrostatic holding force between the platen and a substrate thereon;
   a substrate support within the chamber interior, the substrate support having a support surface and configured to move between a first position and a second position, the first position having the support surface a first distance from the cooled pedestal, the second position having the support surface a second distance from the cooled pedestal greater than the first distance;
   a gas injector configured to provide one or more flows of gas into the chamber interior;
   a heater positioned a third distance from the cooled pedestal, the third distance greater than the first distance and the second distance; and
   a controller configured to perform the method of claim 1 while maintaining the heater at the third distance from the cooled pedestal while chucking the substrate.

15. The processing chamber of claim 14, wherein the gas injector is configured to provide a flow of gas from the sidewall of the chamber body.

16. The processing chamber of claim 14, wherein the controller is configured to rotate the substrate support.

17. The processing chamber of claim 14, wherein the gas injector is configured provide a flow of gas from the top of the chamber body.

18. The processing chamber of claim 14, wherein the heater comprises a plurality of lamps positioned to direct radiant energy through the top of the chamber body.

19. A non-transitory computer readable medium including instructions, that, when executed by a controller of a processing chamber, cause the processing chamber to perform operations of:
    positioning a substrate a first distance from a cooled pedestal, the cooled pedestal comprising an electrostatic chuck, the cooled pedestal positioned a set distance from a gas injector within the processing chamber;
    chucking the substrate using the electrostatic chuck to employ a platen with integral electrodes which are biased with a voltage to establish an electrostatic holding force between the platen and the substrate;
    performing a reaction cycle comprising:
        carrying out a first process at the first distance, the first process having a first temperature and first pressure;
        moving the substrate from the first distance to a second distance from the cooled pedestal, the second distance greater than the first distance;
        carrying out a second process at the second distance, the second process having a second temperature and a second pressure; and
        moving the substrate from the second distance to the first distance,
    wherein the cooled pedestal is maintained the set distance from the gas injector while chucking the substrate and during the reaction cycle.

* * * * *